United States Patent
Holmgren et al.

(10) Patent No.: US 9,246,442 B2
(45) Date of Patent: Jan. 26, 2016

(54) POWER INCREASE BASED ON PACKET TYPE

(71) Applicant: Sonos, Inc., Santa Barbara, CA (US)

(72) Inventors: Steve F. Holmgren, Santa Barbara, CA (US); John L. MacFarlane, Montecito, CA (US)

(73) Assignee: Sonos, Inc., Santa Barbara, CA (US)

( * ) Notice: Subject to any disclaimer, the term of this patent is extended or adjusted under 35 U.S.C. 154(b) by 0 days.

(21) Appl. No.: 14/486,648

(22) Filed: Sep. 15, 2014

(65) Prior Publication Data

US 2015/0005914 A1 Jan. 1, 2015

Related U.S. Application Data

(63) Continuation of application No. 13/212,889, filed on Aug. 18, 2011, now Pat. No. 8,843,224, which is a continuation of application No. 10/845,805, filed on May 15, 2004, now Pat. No. 8,024,055, and a continuation of application No. 14/465,417, filed on Aug. 21, 2014, which is a continuation of application No. 13/212,889, which is a continuation of application No. 10/845,805.

(51) Int. Cl.
*G06F 17/00* (2006.01)
*H03F 1/52* (2006.01)
*H03F 99/00* (2009.01)
*H04R 27/00* (2006.01)

(52) U.S. Cl.
CPC ............... *H03F 1/52* (2013.01); *H03F 21/00* (2013.01); *H04R 27/00* (2013.01); *H04R 2227/005* (2013.01)

(58) Field of Classification Search
CPC .................... H04R 2227/003; H04R 2227/005
USPC .......................................................... 700/94
See application file for complete search history.

(56) References Cited

U.S. PATENT DOCUMENTS

| 4,296,278 A | 10/1981 | Cullison et al. |
| 5,255,094 A | 10/1993 | Yong et al. |
| 5,668,884 A | 9/1997 | Clair et al. |

(Continued)

OTHER PUBLICATIONS

The United States Patent and Trademark Office, "Non-Final Office Action" issued in connection with U.S. Appl. No. 10/845,805, mailed on Jun. 22, 2007, 16 pages.

(Continued)

*Primary Examiner* — Joseph Saunders, Jr.
(74) *Attorney, Agent, or Firm* — McDonnell Boehnen Hulbert & Berghoff LLP

(57) ABSTRACT

Techniques for controlling one or more audio amplifiers in or associated with a device coupled on a local area network are disclosed. An example playback device includes a processor, an amplifier, a network interface, and a memory. The memory includes a software module that, when executed by the processor, causes the playback device to: operate in a first power mode in which the amplifier consumes a first amount of power; while operating in the first power mode, detect that the playback device received, via the network interface, a specified type of data packet; and based on determining that the playback device received the specified type of data packet, transition from operating in the first power mode to operate in a second power mode in which the amplifier consumes a second amount of power, wherein the first amount of power is less than the second amount of power.

21 Claims, 7 Drawing Sheets

(56) References Cited

U.S. PATENT DOCUMENTS

| | | |
|---|---|---|
| 5,673,323 A | 9/1997 | Schotz et al. |
| 5,822,598 A | 10/1998 | Lam |
| 5,857,115 A | 1/1999 | Tanaka |
| 5,946,343 A | 8/1999 | Schotz et al. |
| 6,122,749 A | 9/2000 | Gulick |
| 6,148,345 A | 11/2000 | Yamaki |
| 6,157,726 A | 12/2000 | Carroll et al. |
| 6,316,992 B1 | 11/2001 | Miao et al. |
| 6,388,514 B1 | 5/2002 | King et al. |
| 6,590,982 B1 | 7/2003 | Chen |
| 6,690,431 B1 | 2/2004 | Yang et al. |
| 6,778,869 B2 | 8/2004 | Champion |
| 6,970,940 B1 | 11/2005 | Vogel et al. |
| 7,126,945 B2 | 10/2006 | Beach |
| 7,196,584 B2 | 3/2007 | Harris |
| 7,378,903 B2 | 5/2008 | Bates |
| 7,483,538 B2 | 1/2009 | McCarty et al. |
| 7,571,014 B1 | 8/2009 | Lambourne et al. |
| 7,643,894 B2 | 1/2010 | Braithwaite et al. |
| 7,672,463 B2 | 3/2010 | Park et al. |
| 7,696,816 B2 | 4/2010 | Bates |
| 7,853,341 B2 | 12/2010 | McCarty et al. |
| 8,024,055 B1 | 9/2011 | Holmgren et al. |
| 8,045,952 B2 | 10/2011 | Qureshey et al. |
| 8,103,009 B2 | 1/2012 | McCarty et al. |
| 8,189,816 B2 | 5/2012 | Solow |
| 8,234,395 B2 | 7/2012 | Millington |
| 8,843,224 B2 | 9/2014 | Holmgren et al. |
| 2002/0072816 A1 | 6/2002 | Shdema et al. |
| 2002/0101651 A1 | 8/2002 | Dugan et al. |
| 2002/0124097 A1 | 9/2002 | Isely et al. |
| 2003/0210796 A1 | 11/2003 | McCarty et al. |
| 2005/0177256 A1 | 8/2005 | Shintani et al. |
| 2006/0158168 A1 | 7/2006 | Yoshida et al. |
| 2007/0142944 A1 | 6/2007 | Goldberg et al. |
| 2010/0171587 A1 | 7/2010 | Yoon et al. |
| 2011/0299696 A1 | 12/2011 | Holmgren et al. |
| 2012/0237059 A1 | 9/2012 | Saito |

OTHER PUBLICATIONS

The United States Patent and Trademark Office, "Final Office Action" issued in connection with U.S. Appl. No. 10/845,805, mailed on Nov. 15, 2007, 15 pages.

The United States Patent and Trademark Office, "Non-Final Office Action" issued in connection with U.S. Appl. No. 10/845,805, mailed on Apr. 9, 2008, 16 pages.

The United States Patent and Trademark Office, "Final Office Action" issued in connection with U.S. Appl. No. 10/845,805, mailed on Sep. 5, 2008, 17 pages.

The United States Patent and Trademark Office, "Non-Final Office Action" issued in connection with U.S. Appl. No. 10/845,805, mailed on Aug. 17, 2010, 19 pages.

The United States Patent and Trademark Office, "Final Office Action" issued in connection with U.S. Appl. No. 10/845,805, mailed on Feb. 4, 2011, 18 pages.

The United States Patent and Trademark Office, "Notice of Allowance" issued in connection with U.S. Appl. No. 10/845,805, mailed on May 26, 2011, 14 pages.

The United States Patent and Trademark Office, "Non-Final Office action", issued in connection with U.S. Appl. No. 13/212,889, mailed on Jul. 16, 2013, 11 pages.

The United States Patent and Trademark Office, "Final Office action", issued in connection with U.S. Appl. No. 13/212,889, mailed on Jan. 29, 2014, 13 pages.

The United States Patent and Trademark Office, "Notice of Allowance", issued in connection with U.S. Appl. No. 13/212,889, mailed on May 23, 2014, 14 pages.

Voyetra Turtle Beach, Inc., "AudioTron Quick Start Guide, Version 1.0", Mar. 2001, 24 pages.

Voyetra Turtle Beach, Inc., "AudioTron Reference Manual, Version 3.0", May 2002, 70 pages.

Voyetra Turtle Beach, Inc., "AudioTron Setup Guide, Version 3.0", May 2002, 38 pages.

Jo J., et al., "Synchronized One-to-many Media Streaming with Adaptive Playout Control," Proceedings of SPIE, 2002, vol. 4861, pp. 71-82.

Microsoft Corporation, "UPNP Universal Plug and Play Device Architecture", Jun. 8, 2000, version 1.0; pp. 1-54.

Non-Final Office Action issued in connection with U.S. Appl. No. 14/465,417, mailed on Jul. 17, 2015, 13 pages.

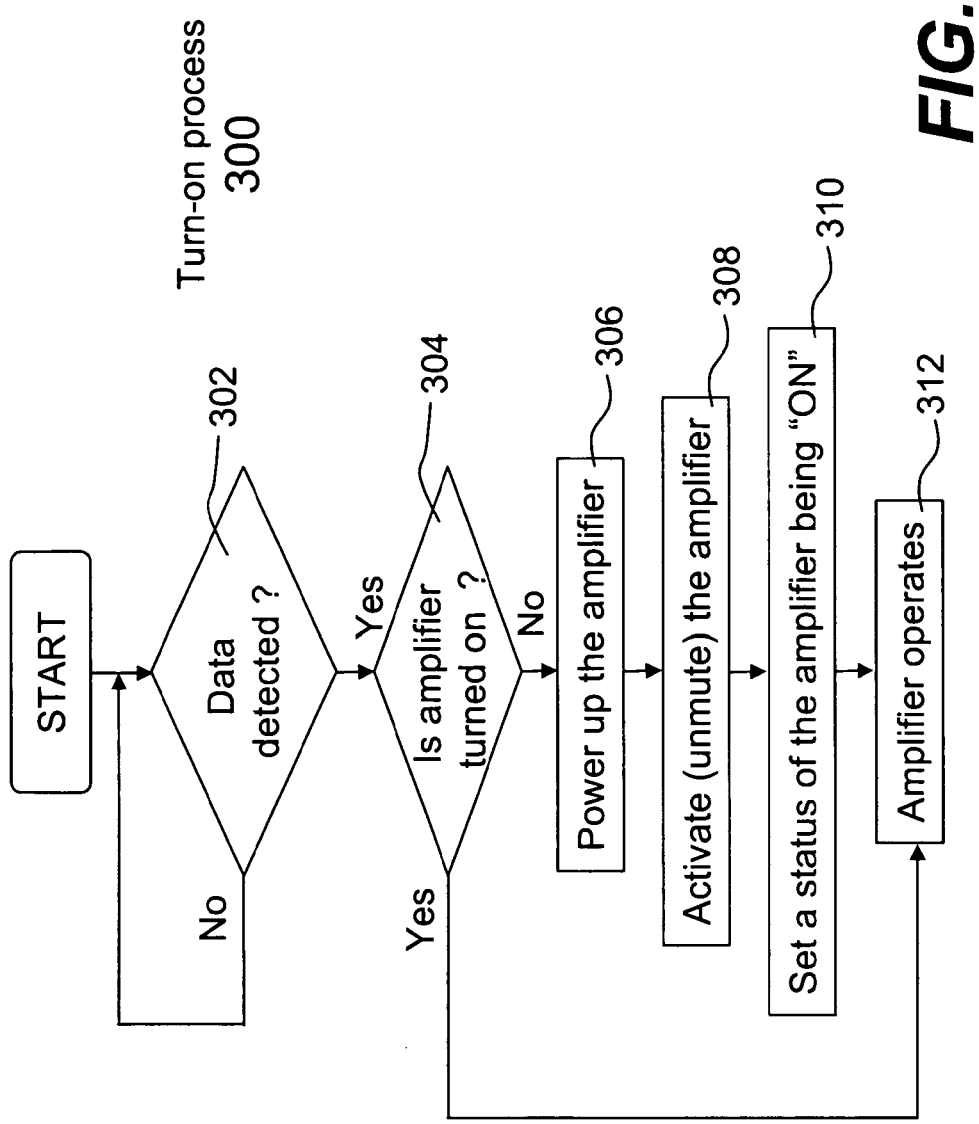

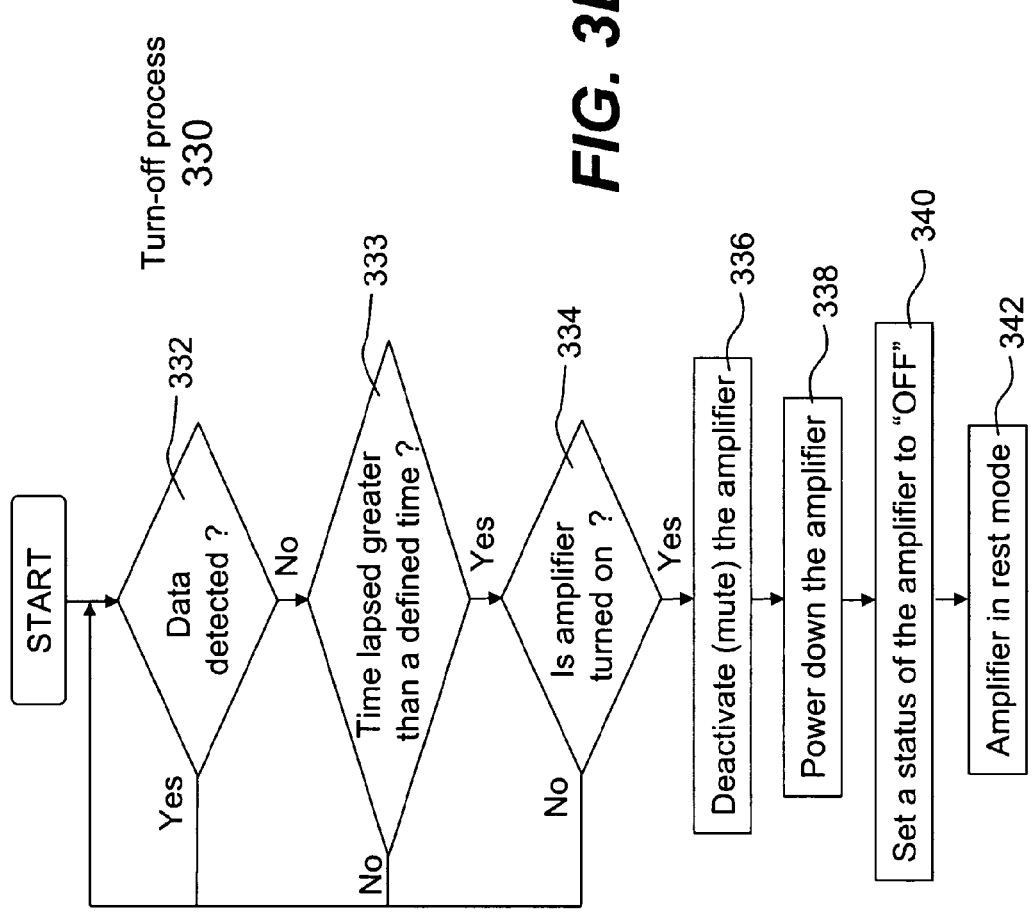

POWER INCREASE BASED ON PACKET TYPE

CROSS-REFERENCE TO RELATED APPLICATIONS

This application is a continuation of and claims priority to patent application Ser. No. 13/212,889 filed Aug. 18, 2011, entitled "METHOD AND SYSTEM FOR CONTROLLING AMPLIFIERS", to patent application Ser. No. 10/845,805, filed May 15, 2004, entitled "METHOD AND SYSTEM FOR CONTROLLING AMPLIFIERS"; this application also claims priority as a continuation to U.S. patent application Ser. No. 14/465,417, filed on Aug. 21, 2014, entitled "METHOD AND SYSTEM FOR CONTROLLING AMPLIFIERS", which is a continuation of patent application Ser. No. 13/212,889 filed Aug. 18, 2011, entitled "METHOD AND SYSTEM FOR CONTROLLING AMPLIFIERS", and to patent application Ser. No. 10/845,805, filed May 15, 2004, entitled "METHOD AND SYSTEM FOR CONTROLLING AMPLIFIERS", each of which is hereby incorporated by reference in its entirety for all purposes.

BACKGROUND OF THE INVENTION

1. Field of the Invention

The invention is generally related to the area of audio technologies. In particular, the invention is related to controlling of audio amplifiers in devices based upon data traffic detection.

2. The Background of Related Art

Automatic power shutdown is an important feature in many electrical appliances. One of the appliances commonly seen is a stereo system that includes a powered subwoofer. The subwoofer is automatically shutdown when the stereo system is powered off or produces no sound (e.g., in CD mode with no CD is played). On the other end, the subwoofer is automatically tuned on when the stereo system is powered on, thus eliminating the need of turning on or off two devices manually or sequentially. Another example is an uninterruptible power supply (UPS) supporting a computer system. The UPS provides power in an event that regular power to the computer system is suddenly off. As an automated preventative measure, the computer system is configured to shut down itself when the UPS is running on a low battery level or beyond a predetermined time so as to avoid corrupting files, or damaging other parts in the computer system.

The implementation of the automatic power shutdown feature is largely based upon special circuitry or analog control circuits to detect a signal level against a predetermined level. In the stereo system example, if audio signals to the subwoofer are not detected or substantially lower than a fixed level for a period of time, the subwoofer is sent a signal to be powered off. Likewise, when audio signals to the subwoofer are detected, the subwoofer is sent a signal to be powered on. In the UPS example, the detection mechanism is similar. The battery in the UPS is constantly or periodically measured against a predetermined level or the operation time thereof is measured. When either one of the measurements is below a certain level, the computer system receives a signal or an instruction that triggers the automatic shutdown process.

The analog solution of automatic power shutdown is not effective when used in a distributed system comprising multiple devices that need to automatically shut down while not in use. For example, a plurality of networked audio devices each of which has or associated with one or more power amplifiers share audio sources. The detection of an analog signal to one of the audio devices on a data network would be difficult and ineffective. Additional hardware (i.e., circuitry), if needed, would increase the cost and complexity of such system. There is, therefore, a need for solutions of automatic shutdown suitable for such system without adding extra hardware.

SUMMARY OF THE INVENTION

This section is for the purpose of summarizing some aspects of the present invention and to briefly introduce some preferred embodiments. Simplifications or omissions in this section as well as in the abstract or the title of this description may be made to avoid obscuring the purpose of this section, the abstract and the title. Such simplifications or omissions are not intended to limit the scope of the present invention.

In general, the present invention pertains to controlling one or more audio amplifiers in or associated with a device coupled on a local area network and receiving at least one selected source from other devices also coupled on the network. The device may be an audio device for playing back audio resources stored on the other devices. According to one aspect of the present invention, an automatic shutdown control module is provided in the device to power down the audio amplifiers when there is no audio data flow coming to the device or power up the audio amplifiers when there is audio data flow coming to the device.

All types of traffic may present on a local area network, including data other than those from an audio source. The present invention relying upon traffic of only the data from one or more audio sources to control the operation of audio amplifiers. When audio traffic to a device is absent for a defined time, an audio amplifier in or associated with the device is automatically powered down. The defined time may be a fixed time or derived from a set of data collected over a time period regarding a time lapse not intended for powering down the audio amplifier.

According to another aspect of the present invention, the procedure to power down or power up the amplifiers is in accordance with a hysteresis, wherein the hysteresis, being lagging of an effect behind its cause, protects the amplifiers and makes the powering-down or powering-up procedure unnoticeable to a user. As such, the implementation of the hysteresis protects the amplifiers from being turned on or off in quick succession.

The present invention may be implemented in many forms including software, hardware or a combination of both. According to one embodiment, the present invention is an apparatus for controlling an audio amplifier, the apparatus comprises: a network interface communicating with a data network, a control module, coupled to the network interface, configured to detect any data packets coming from the data network; when none of the data packets is detected relating to an audio source for a defined time, the control module causing the audio amplifier to be powered down; when the data packets is detected relating to an audio source, the control module causing the audio amplifier to be powered on.

All types of traffic may be present on a local area network, including data other than those from an audio source. The present invention relies upon traffic of only the data from one or more audio sources to control the operation of audio amplifiers. When audio traffic to a device is absent for a defined time, an audio amplifier in or associated with the device is automatically powered down. The defined time may be a fixed time or derived from a set of data collected over a time period regarding a time lapse not intended for powering down the audio amplifier.

One of the objects, features, advantages of the present invention is to use data traffic pertaining only to the data of the audio source to control audio amplifiers.

Other objects, features, and advantages of the present invention will become apparent upon examining the following detailed description of an embodiment thereof, taken in conjunction with the attached drawings.

BRIEF DESCRIPTION OF THE DRAWINGS

These and other features, aspects, and advantages of the present invention will become better understood with regard to the following description, appended claims, and accompanying drawings where:

FIG. 3A shows a flowchart or process of powering on an amplifier according to one embodiment of the present invention;

FIG. 3B shows a flowchart or process of powering down an amplifier according to one embodiment of the present invention;

DETAILED DESCRIPTION OF THE PREFERRED EMBODIMENT

The present invention pertains to designs of controlling one or more audio amplifiers in or associated with a device coupled on a local area network and receiving at least one selected source from other devices also coupled on the network. The device may be an audio device for playing back audio resources stored on the other devices. According to one aspect of the present invention, an automatic shutdown control module is provided in the device to power down the audio amplifiers when there is no audio data flow coming to the device or power up the audio amplifiers when there is audio data flow coming to the device. In one embodiment, the procedure to power down or power up the amplifiers is in accordance with a hysteresis, wherein the hysteresis, being lagging of an effect behind its cause, protects the amplifiers and makes the powering-down or powering-up procedure unnoticeable to a user.

The detailed description of the present invention is presented largely in terms of procedures, steps, logic blocks, processing, or other symbolic representations that directly or indirectly resemble the operations of devices or systems that can be used in networks. These descriptions and representations are typically used by those skilled in the art to most effectively convey the substance of their work to others skilled in the art.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Further, the order of blocks in process flowcharts or diagrams representing one or more embodiments of the invention do not inherently indicate any particular order nor imply any limitations in the invention.

Figure 1:
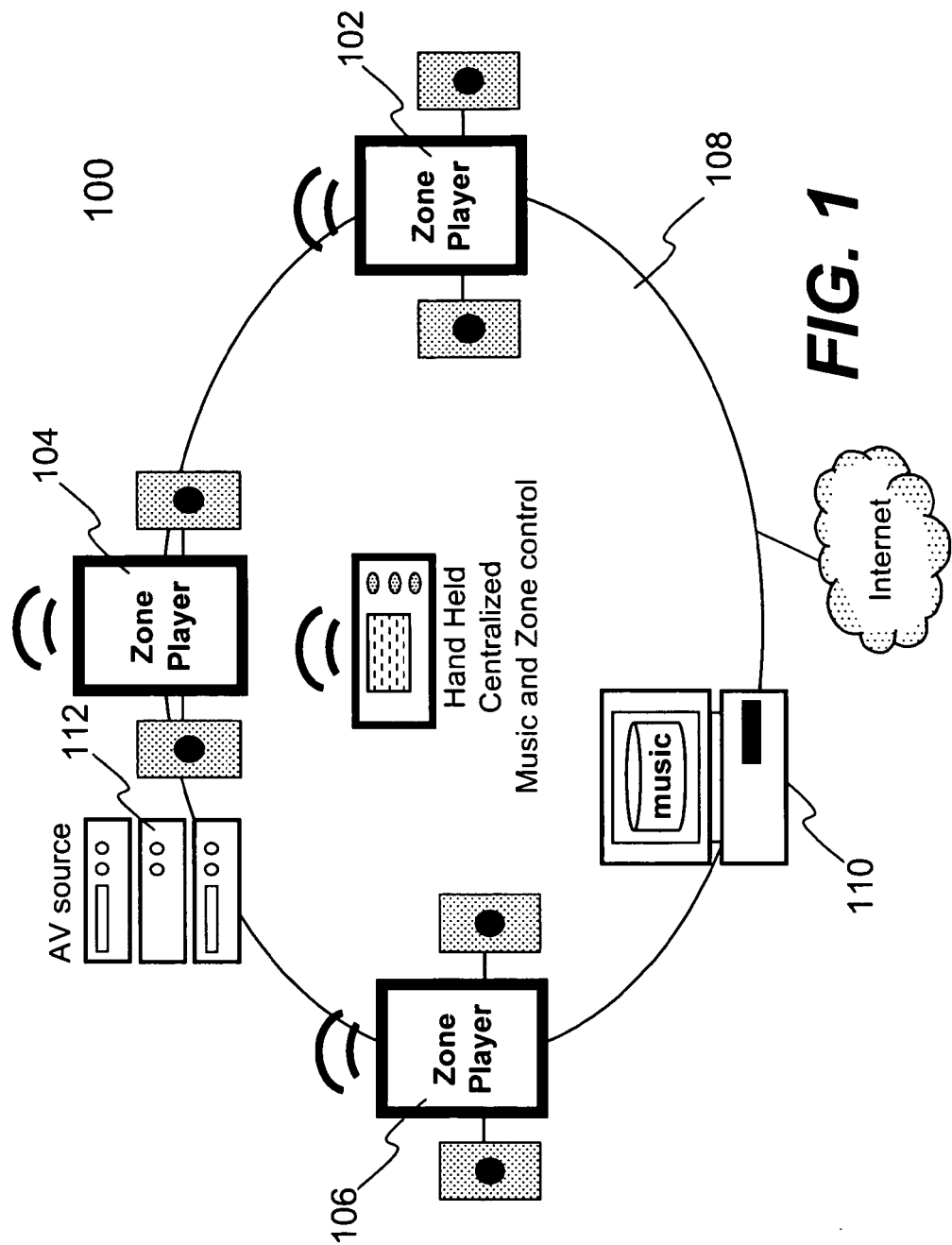
FIG. 1 shows a configuration in which the present invention may be practiced, the configuration may represent, but not be limited to, a part of a residential home, a business building or a complex.

Referring now to the drawings, in which like numerals refer to like parts throughout the several views. FIG. 1 shows an exemplary configuration 100 in which the present invention may be practiced. The configuration may represent, but not be limited to, a part of a residential home, a business building or a complex. There are a number of audio devices of which three examples 102, 104 and 106 are shown. Each of the audio devices may be installed or provided in one particular area or zone and hence referred to as a zone player herein.

As used herein, unless explicitly stated otherwise, an audio source or audio sources are in digital format and can be transported over a data network. A term "power down" or "power off" an audio amplifier does not necessarily mean that a power supply to the audio amplifier is completely disconnected and in most cases mean that the audio amplifier operates in a sleeping mode so as to consume a minimum amount of power.

To facilitate the understanding of the present invention, it is assumed that the configuration 100 represents a home. Thus, the zone player 102 and 104 may be in two bedrooms respectively while the zone player 106 may be in a living room. All of the zone players 102, 104 and 106 are coupled to a data network 108. In addition, a computing device 110 is shown to be coupled on the network 108. In reality, any other devices such as a home gateway device, a storage device, or an MP3 player may be coupled to the network 108 as well.

The network 108 may be a wired network, a wireless network or a combination of both. In one example, all devices including the zone players 102, 104 and 106 are coupled to the network 108 by wireless means based on an industry standard such as 811.02 or WiFi. In another example, all devices including the zone players 102, 104 and 106 are part of a local area network that communicate with a wide area network (e.g., the Internet).

Many devices on the network 108 are configured to download and store audio sources. For example, the computing device 110 can download audio sources from the Internet and store the downloaded sources locally for sharing with other devices on the Internet or the network 108. The computing device 110 can also be configured to receive streaming audios. Shown as a stereo system, the device 112 is configured to convert an analog source (e.g., from broadcasting) to a digital audio source or retrieve an audio source (e.g., from a compact disk). In accordance with the present invention, the audio source may be shared among the devices on the network 108. Although each of the zone players may be configured to be able to download or store audio resources, the following description is based on the assumption that the zone players are pure players and need to retrieve selected audio sources from other devices (e.g., the compute system 110) for playback.

Figure 2A:
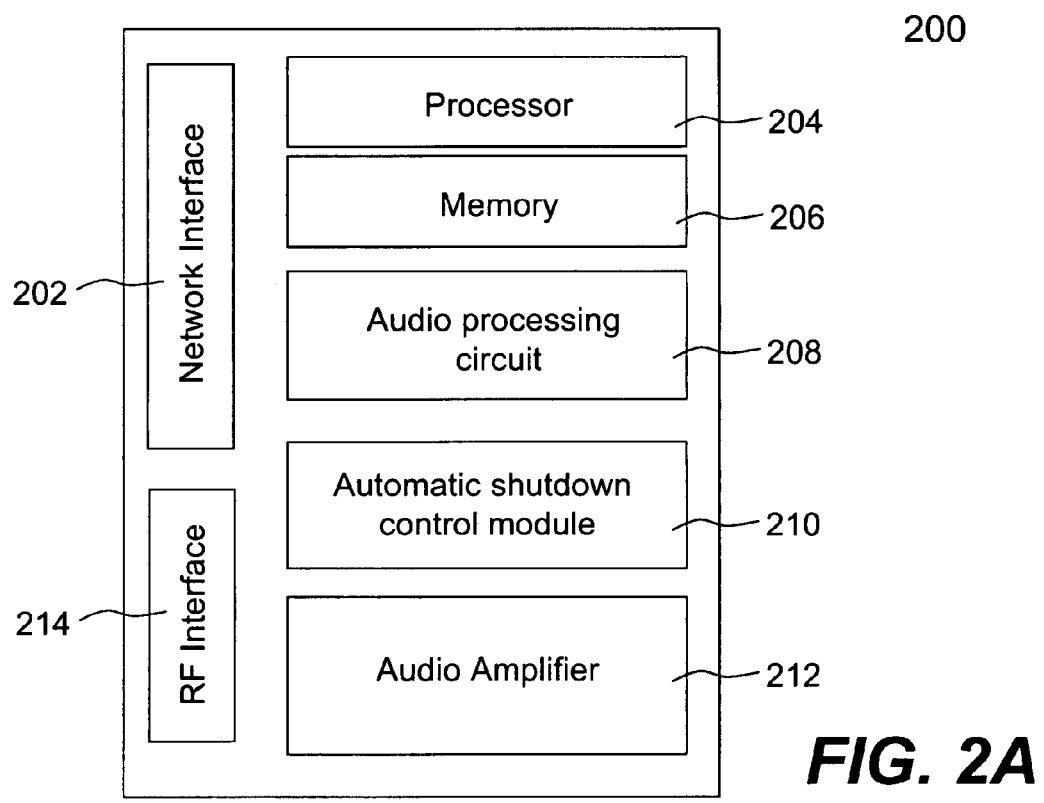
FIG. 2A shows an exemplary functional block diagram of a zone player in accordance with the present invention.

FIG. 2A shows an exemplary functional block diagram of a zone player 200 in accordance with the present invention. The zone player 200 includes a network interface 202, a processor 204, a memory 206, an audio processing circuit 208, an automatic shutdown control module 210, and an audio amplifier 212. The audio amplifier 212 may represent multiple amplifiers. The network interface 202 facilitates a data flow between a data network (i.e., the data network 108 of FIG. 1) and the zone player 200 and typically executes a special set of rules (i.e., a protocol) to send data back and forth. One of the common protocols is TCP/IP (Transmission Control Protocol/Internet Protocol) commonly used in the Internet. In general, a network interface manages the assembling of an audio source or file into smaller packets that are transmitted over the data network or reassembles received packets into the original source or file. In addition, the network interface 202 handles the address part of each packet so that it gets to the right destination or intercepts packets destined for the zone player 200.

The network 108 may be a wired network, a wireless network or a combination of both. In one example, all devices including the zone players 102, 104 and 106 are coupled to the network 108 by wireless means based on an industry standard such as 802.11 or WiFi. In another example, all devices including the zone players 102, 104 and 106 are part of a local area network that communicate with a wide area network (e.g., the Internet).

The processor 204 is configured to control the operation of other parts in the zone player 200. The memory 206 may be loaded with software modules that can be executed by the processor 204 to achieve desired tasks. According to one aspect of the present invention, a software module implementing one embodiment of the present invention is executed, the automatic shutdown control module operates in accordance with the software module to control the operation of the audio amplifier 212 so as to turn the audio amplifier 212 off when the zone player 200 is not in use or turn the audio amplifier 212 on when the zone player 200 is to play back a selected audio source.

The audio processing circuit 208 resembles most of the circuitry in an audio playback device and includes one or more digital-to-analog converters (DAC), an audio preprocessing part, an audio enhancement part or a digital signal processor and others. In operation, when an audio source is retrieved via the network interface 202, the audio source is processed in the audio processing circuit 208 to produce analog audio signals. The processed analog audio signals are then provided to the audio amplifier 212 for playback on nearby speakers.

Figure 2B:
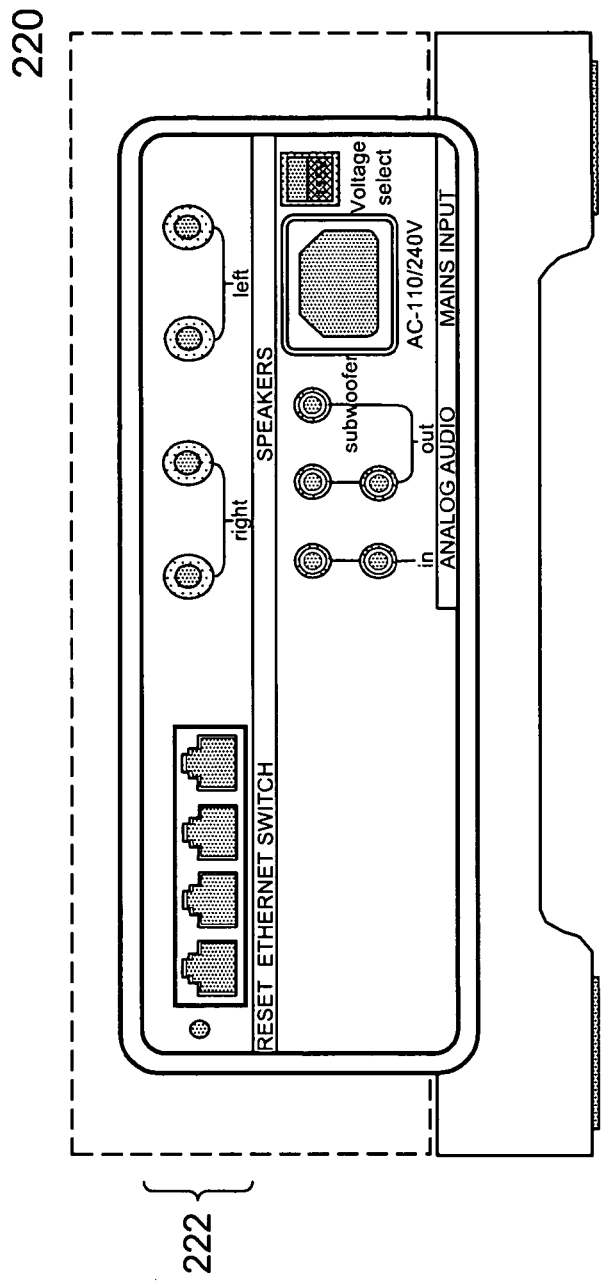
FIG. 2B shows an exemplary panel configuration of a zone player according to one embodiment of the present invention.

FIG. 2B shows an exemplary panel configuration 220 of the zone player 200 according to one embodiment of the present invention. It can be appreciated by those skilled in the art that, the zone player 200 is configured to be able to communicate with other devices via the data ports 222 and share the audio sources with other zone players. In particular, the data ports 222 allow the zone player 200 to retrieve a selected song or a selected piece of music from a device on the network 108.

Figure 2C:
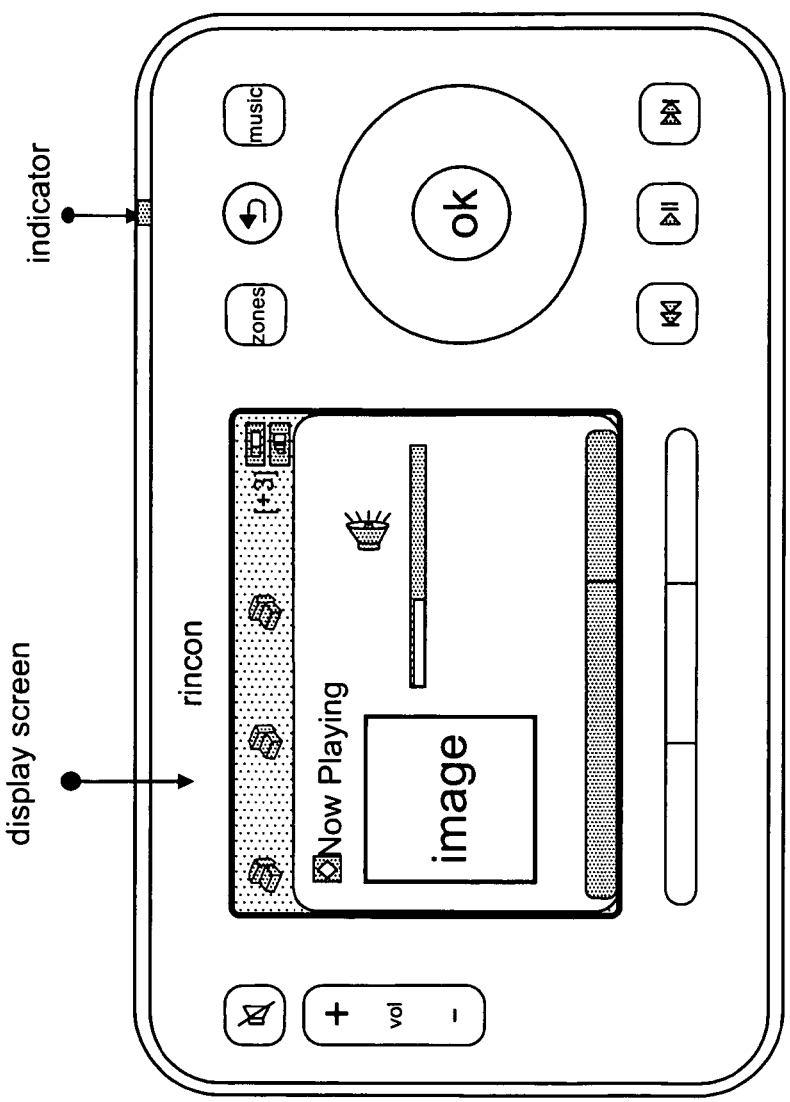
FIG. 2C shows a remote controller that may be used to control one of the zone players in a distributed audio system.

The RF interface 214 provides wireless means for the zone player 200 to communicate with a controller, preferably a portable. An example of the controller 240 is shown in FIG. 2C. According to one embodiment, the wireless means is based on an industry standard (e.g., infrared, radio, wireless standard 802.11b or 802.11g). The controller 240 may be used to facilitate a selection of a plurality of audio sources available on the network, controlling operation of the zone player 200 through the RF interface 214. When a particular audio source is being played in the zone player 200, a picture, if there is any, associated with the audio source may be transmitted from the zone player 200 to the controller 240. As shown in FIG. 2C, many operations of the zone player 200 can be remotely controlled via the RF interface 214.

FIG. 3A and FIG. 3B show respectively a flowchart or process 300 and 330 of a module implementing one embodiment of the present invention. The process 300 and 330, which is preferably understood in conjunction with the previous figures, may be implemented in software, hardware, or a combination of both. According to one embodiment, the module is embedded in a zone player (e.g., in the memory 206 in FIG. 2A) and can be executed to control the automatic shutdown of the audio amplifier in the zone player or associated with the zone player.

The process 300 of FIG. 3A implements an automatic turn-on (i.e., power up) capability. At 302, the process 300 detects if there is any audio source received. Depending on implementation, such detection may be implemented in a few places including the network or within the zone player. According to one embodiment, the module is configured to detect whether there is any data packets (e.g., part of the audio stream) in the network interface or other layers thereof. When no data flow is detected, the process 300 stays where it is at 302, namely, no action would be taken. When a data flow is detected, the process 300 moves onto 304.

It should be noted that the criteria of detecting the presence of data may vary depending on an exact implementation of the distributed digital audio system. In one embodiment, the zone player may be configured to receive data other than the audio data, where the audio data represents the audio source and the data other than the audio data may include commands or control information. Accordingly, a data packet may be analyzed to determine whether it represents part of an audio source. If the data packet is other than the audio data, the process 300 stays where it is at 302. The process 300 moves onto 303 only when one or more audio data packets are detected.

At 304, the status of the amplifier is determined. The amplifier may be already powered on and is operating, in which case the process 300 does nothing by going to 312. This happens usually in the middle of playing back a piece of music or in an interim (i.e., a temporary lapse) that happens, for example, when a new audio source is selected or to be started after a current one is just finished or jumping ahead of a few tracks in an audio source. In another case, however, the amplifier has been powered off and now needs to be turned back on to facilitate the playback of a received audio source. The process 300 now goes to 306 to power up the amplifier.

To avoid a sudden noise coming out from speakers when the amplifier is tuned on or off, the control of the amplifier is performed in accordance with a hysteresis, wherein the hysteresis, being lagging of an effect behind its cause, protects the amplifiers and makes the powering-down or powering-up procedure unnoticeable to a user. In other words, the hysteresis mutes or smoothes out possible noises or frequency as a result of the amplifier being "ON" from "OFF" or being "OFF" from "ON".

It should be noted that the criteria of detecting the presence of data may vary depending on an exact implementation of the distributed digital audio system. In one embodiment, the zone player may be configured to receive data other than the audio data, where the audio data represents the audio source and the data other than the audio data may include commands or control information. Accordingly, a data packet may be analyzed to determine whether it represents part of an audio source. If the data packet is other than the audio data, the process 300 stays where it is at 302. The process 300 moves onto 304 only when one or more audio data packets are detected.

In one embodiment, to control the operation of the amplifier precisely, one or more parameters about the status of the amplifier are used. The parameters may be referred to when the status of the amplifier is determined. At 310, the status of the amplifier is set to be "ON". The process 300 then goes to 312 where the amplifier operates in working mode, namely amplifying processed analog audio signals to drive speakers.

On the other end, the process 330 of FIG. 3B implements an automatic turn-off (i.e., power down). At 332, the process 330 detects if there is any audio source received. As described before, depending on implementation, such detection may be implemented in a few places including the network or within the zone player. According to one embodiment, the module is configured to detect whether there is any data packets (e.g., part of the audio stream) in the network interface or other layers thereof. When a data flow is detected, the process 330 stays where it is at 332, namely, no action would be taken. When no data flow is detected, the process 330 moves onto 333. There are certain situations in which no (audio) data flow can be detected, for example, during two separate songs. To ensure a proper shut-down process, at 333, a time lapsed for no data flow is measured. In one embodiment, the time is compared to a predetermined time, for example, 3 seconds, if the time is shorter than the predetermined time, namely before the predetermined time is lapsed, the process 330 goes back to 332 to continue the detection of the data flow. When the time is longer than the predetermined time, the process 330 moves onto 334.

According to one embodiment, to avoid powering the amplifier down during an interim (e.g., switching from one music to another, browsing a collection of songs), the time to determine whether the amplifier shall be powered down is implemented intelligently. For example, using the predetermined time as a base or a reference point, historical data on the durations between two consecutive pieces of music beyond the predetermined time is collected. Accordingly, an appropriate time can thus be derived from the data. As the process 300 as well as 330 can be implemented in software, various algorithms to determine such appropriate time are known to those skilled in the art and can be adopted relatively easy in the software implementation. It may be appreciated by now that the current invention provides the flexibility to determine how to control the amplifier, while the prior art shutdown systems obviously lack such control flexibility and must be equipped with additional circuitry.

It should be noted that the data flow herein pertain to an audio source. In one embodiment, the zone player may be configured to receive data other than the audio data, where the audio data represents the audio source and the data other than the audio data may include commands or control information). Accordingly, a data packet may be analyzed to determine whether it represents part of an audio source that is selected for playback. If the data packet is indeed the audio data, the process 330 stays where it is at 332. The process 330 moves onto 334 only when no audio data is detected.

At 334, the status of the amplifier is checked. If the status of the amplifier shows that it is already off, there is no further action needed. If the status of the amplifier shows that the amplifier has been "ON", the process 330 goes to 336 to first mute the amplifier and then power down the amplifier at 338. After the amplifier is powered down or the status of the amplifier has changed, the process 330 goes to 340 to update the status of the amplifier by resetting one or more parameters representing the status thereof to "OFF" at 340. Consequently, the amplifier goes to rest mode at 342.

Figure 4:
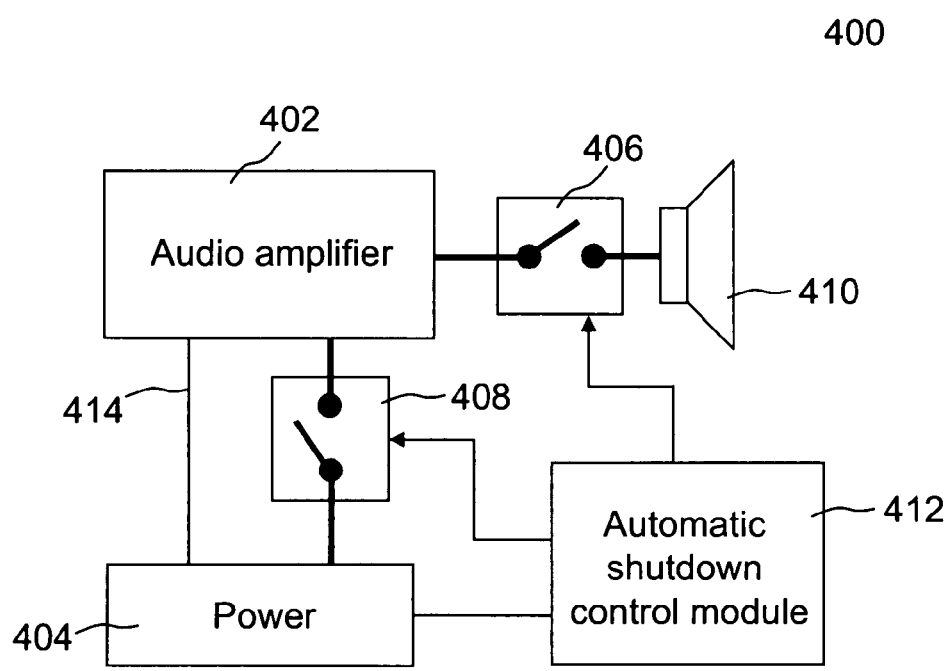
FIG. 4 shows an exemplary implementation of controlling an audio amplifier.

Referring now to FIG. 4, there shows an exemplary implementation 400 of controlling an audio amplifier 402. The automatic shutdown control module 404 operates in response to the detection of the audio data packets. At least two electronic connections 406 and 408 are controlled by the automatic shutdown control module 404. It is understood by those skilled in the art that the electronic connections 406 and 408 are not necessarily switches. Functionally, signals from the audio amplifier to speakers 410, power from a power supply 412 to the audio amplifier 402 or vice versa are controlled by the automatic shutdown control module 404.

In one embodiment, there is a small amount of power supplied to the audio amplifier 402 via an uncontrolled electronic connection 414 to keep a portion of the audio amplifier 402 to operate or to react to an instruction for the status of the audio amplifier to change. In operation, when the audio amplifier 402 is powered down, the audio amplifier 402 is to be deactivated or muted first and then powered down. This may be achieved by disconnecting the electronic connection 406 or preventing any signal from going to the speakers 410, and followed by disconnecting the electronic connection 408. Likewise, when the audio amplifier 402 is powered up to operate in working mode, the audio amplifier 402 is powered up and then activated. This may be achieved by restoring the electronic connection 408 and followed by restoring the electronic connection 406.

The present invention can be implemented in many ways, each of which may yield one or more of the following benefits, advantages or features. First, the control of an audio amplifier is based on a data flow of an audio source. The audio source is retrieved and comes from a network that has other data traffics. The present invention uses data traffic pertaining only to the data of the audio source to control the audio amplifier. Second, a flexible mechanism in terms of time of the absence of an audio data flow is provided, which could be hardly realized in a prior art system involving hardware. Third, the software-based implementation of controlling one or more amplifiers makes it possible to determine an appropriate define time, with a more sophisticated algorithm, to power down or up the amplifiers. In reality, it is desirable to control the amplifiers intelligently so as to achieve a longer operating lifespan of the amplifiers and save more power. Other benefits, advantages or features can be appreciated by those skilled in the art given the detailed description herein.

Referring now to FIG. 4, there shows an exemplary implementation 400 of controlling an audio amplifier 402. The automatic shutdown control module 412 operates in response to the detection of the audio data packets. At least two electronic connections 406 and 408 are controlled by the automatic shutdown control module 412. It is understood by those skilled in the art that the electronic connections 406 and 408 are not necessarily switches. Functionally, signals from the audio amplifier to speakers 410, power from a power supply 404 to the audio amplifier 402 or vice versa are controlled by the automatic shutdown control module 412.

We claim:

1. A playback device comprising:
   a processor;
   an amplifier;
   a network interface; and
   tangible, non-transitory, computer-readable memory comprising instructions that, when executed by the processor, cause the playback device to:
   operate in a first power mode in which the amplifier consumes a first amount of power;
   while operating in the first power mode, receive one or more packets addressed to the playback device via the network interface and determine that the one or more received packets comprises a specified type of data packet; and
   after determining that the one or more received packets comprises the specified type of data packet, transition from operating in the first power mode to operating in a second power mode in which the amplifier consumes a second amount of power, wherein the first amount of power is less than the second amount of power.

2. The playback device of claim 1, wherein the specified type of data packet is a data packet associated with an audio source.

3. The playback device of claim 1, wherein the specified type of data packet is a data packet received from an audio source.

4. The playback device of claim 1, wherein the amplifier comprises an analog circuit.

5. The playback device of claim 1, wherein the specified type of data packet comprises audio content from an audio source.

6. The playback device of claim 1, wherein the specified type of data packet comprises a packet of an audio stream from an audio source.

7. The playback device of claim 1, wherein the specified type of data packet comprises a control packet that comprises control information relating to an audio stream from an audio source, wherein the control packet is received from one of the audio source or a computing device separate from the audio source.

8. The playback device of claim 1, wherein the specified type of data packet comprises a control packet comprising a command to start playback of an audio stream.

9. The playback device of claim 1, wherein transitioning from operating in the first power mode to operating in the second power mode comprises switching at least one electronic connection.

10. The playback device of claim 1, wherein the first amount of power is no power.

11. The playback device of claim 1, wherein the first amount of power is greater than no power.

12. A method comprising:
a playback device operating in a first power mode in which an amplifier of the playback device consumes a first amount of power;
while operating in the first power mode, the playback device (i) receiving one or more packets addressed to the playback device, and (ii) determining that the one or more received packets comprises a specified type of data packet; and
after determining that the one or more received packets comprises the specified type of data packet, the playback device transitioning from operating in the first power mode to operating in a second power mode in which the amplifier consumes a second amount of power, wherein the first amount of power is less than the second amount of power.

13. The method of claim 12, wherein the specified type of data packet is a data packet associated with an audio source.

14. The method of claim 12, wherein the specified type of data packet comprises audio content received from an audio source.

15. The method of claim 12, wherein the specified type of data packet comprises a packet of an audio stream from an audio source.

16. The method of claim 12, wherein the specified type of data packet comprises a control packet comprising a command to start playback of an audio stream from an audio source, wherein the control packet is received from the audio source or a computing device separate from the audio source.

17. The method of claim 12, wherein the second amount of power is greater than no power.

18. A tangible, non-transitory computer-readable storage medium having stored therein instructions executable by one or more processors, wherein the instructions, when executed by the one or more processors, cause a playback device to perform a method comprising:
operating, the playback device in a first power mode in which an amplifier of the playback device consumes a first amount of power;
while operating in the first power mode, the playback device (i) receiving one or more packets addressed to the playback device and (ii) determining that the one or more received packets comprises a specified type of data packet; and
after determining that the playback device received the specified type of data packet, the playback device transitioning from operating in the first power mode to operating in a second power mode in which the amplifier consumes a second amount of power, wherein the first amount of power is less than the second amount of power.

19. The tangible, non-transitory computer-readable storage medium of claim 18, wherein the specified type of data packet is a data packet associated with an audio source.

20. The tangible, non-transitory computer-readable storage medium of claim 18, wherein the specified type of data packet comprises control information relating to an audio stream from an audio source, wherein the control information is received from one of the audio source or a computing device separate from the audio source.

21. The tangible, non-transitory computer-readable storage medium of claim 18, wherein the specified type of data packet comprises a control packet comprising a command to start playback of an audio stream.

* * * * *